United States Patent
Sekiya

(10) Patent No.: US 8,431,428 B2
(45) Date of Patent: Apr. 30, 2013

(54) OPTICAL DEVICE WAFER PROCESSING METHOD AND LASER PROCESSING APPARATUS

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 148 days.

(21) Appl. No.: 13/089,767

(22) Filed: Apr. 19, 2011

(65) Prior Publication Data

US 2011/0256689 A1 Oct. 20, 2011

(51) Int. Cl.
*H01L 21/00* (2006.01)

(52) U.S. Cl.
USPC ............... 438/68; 438/33; 438/113; 438/460; 438/463; 219/121.61; 219/121.67; 219/121.72; 219/121.78; 257/E21.001

(58) Field of Classification Search .................... 438/33, 438/68, 463; 257/E21.001; 219/121.61, 219/121.67, 121.72, 121.78
See application file for complete search history.

(56) References Cited

U.S. PATENT DOCUMENTS

| | | | | |
|---|---|---|---|---|
| 6,974,711 B2* | 12/2005 | Yanagisawa et al. | ........... | 438/26 |
| 7,737,000 B2* | 6/2010 | Rommeveaux et al. | ....... | 438/460 |
| 2012/0211748 A1* | 8/2012 | Miccoli et al. | .................. | 257/52 |

FOREIGN PATENT DOCUMENTS

JP 10-305420 11/1998

* cited by examiner

*Primary Examiner* — Angel Roman
(74) *Attorney, Agent, or Firm* — Greer, Burns & Crain, Ltd

(57) ABSTRACT

An optical device wafer processing method including a laser processed groove forming step of applying a laser beam for performing ablation to the front side or back side of a substrate of an optical device wafer along streets, thereby forming a laser processed groove as a break start point on the front side or back side of the substrate along each street, and a wafer dividing step of applying an external force to the optical device wafer after performing the laser processed groove forming step to thereby break the wafer along each laser processed groove, thereby dividing the wafer into individual optical devices. In performing the laser processed groove forming step, an etching gas atmosphere for etching a modified substance produced by applying the laser beam to the substrate is generated, whereby an etching gas in the etching gas atmosphere is converted into a plasma by the application of the laser beam to thereby etch away the modified substance.

2 Claims, 7 Drawing Sheets

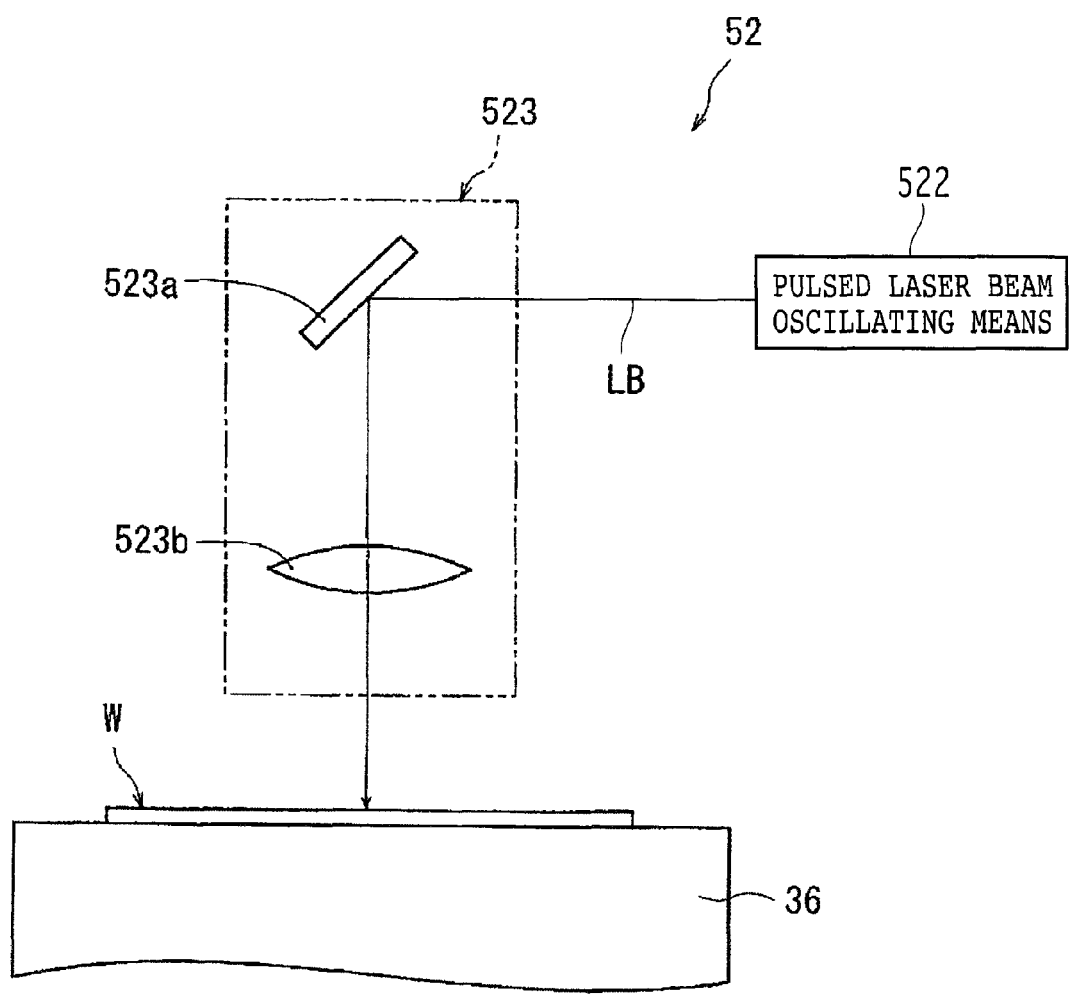

FIG. 4A
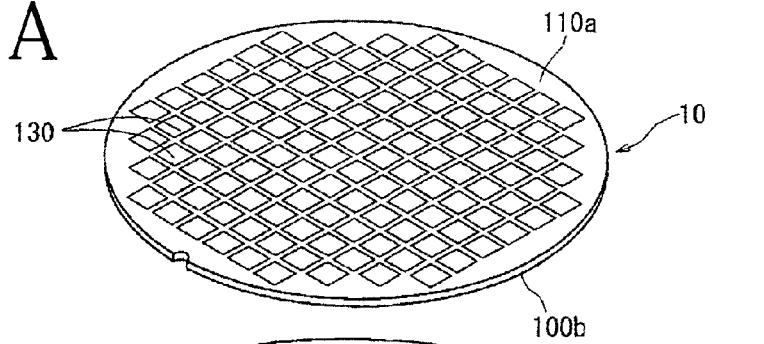
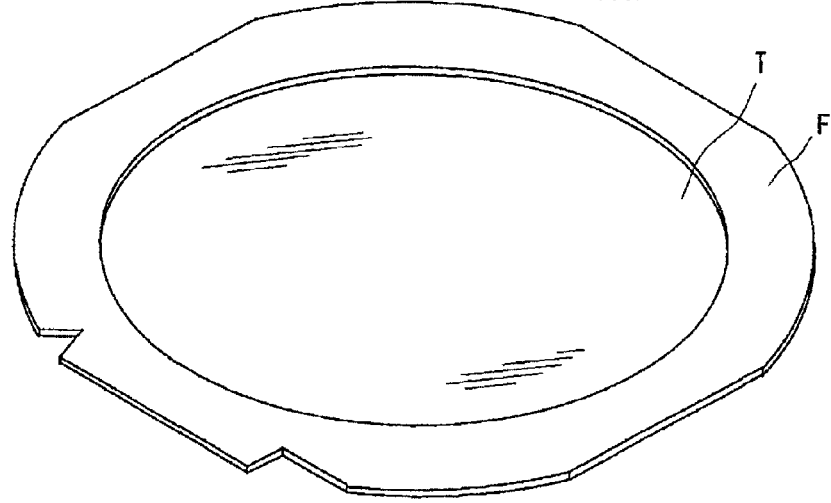
FIG. 4B
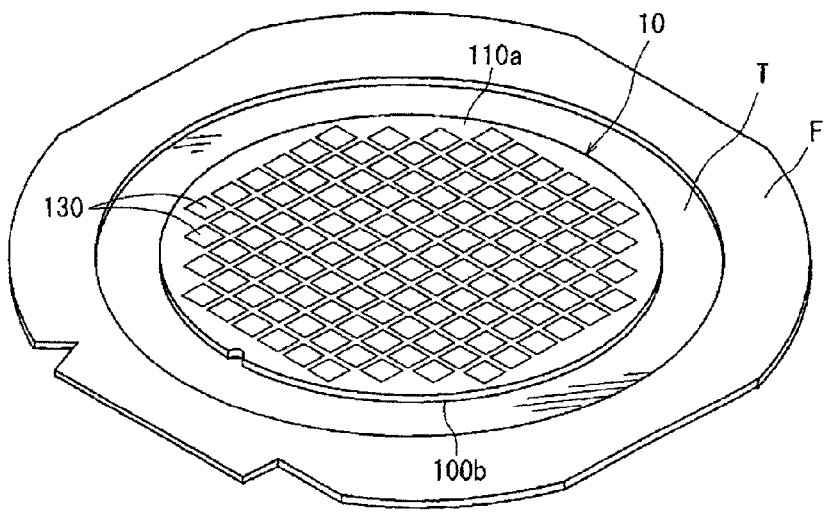

OPTICAL DEVICE WAFER PROCESSING METHOD AND LASER PROCESSING APPARATUS

BACKGROUND OF THE INVENTION

1. Field of the Invention

The present invention relates to an optical device wafer processing method and a laser processing apparatus for dividing an optical device wafer into individual optical devices along a plurality of crossing streets formed on the front side of the optical device wafer, the optical device wafer being composed of a substrate and an optical device layer formed on the front side of the substrate, the individual optical devices being respectively formed in a plurality of regions partitioned by the streets.

2. Description of the Related Art

In an optical device fabrication process, an optical device layer of a gallium nitride compound semiconductor is formed on the front side of a substantially disk-shaped substrate such as a sapphire substrate and a silicon carbide substrate, and this optical device layer is partitioned by a plurality of crossing streets into a plurality of regions where optical devices such as light emitting diodes (LEDs) and laser diodes (LDs) are respectively formed, thus constituting an optical device wafer. The optical device wafer is cut along the streets to thereby divide the regions where the optical devices are formed from each other, thus obtaining the individual optical devices.

Cutting of the optical device wafer along the streets is usually performed by using a cutting apparatus called a dicing saw. This cutting apparatus includes a chuck table for holding a workpiece, cutting means for cutting the workpiece held on the chuck table, and feeding means for relatively moving the chuck table and the cutting means. The cutting means includes a rotating spindle, a cutting blade mounted on the rotating spindle, and a driving mechanism for rotationally driving the rotating spindle. The cutting blade is composed of a disk-shaped base and an annular cutting edge mounted on a side surface of the base along the outer circumference thereof. The cutting edge is formed by fixing diamond abrasive grains having a grain size of about 3 µm to the base by electroforming so that the thickness of the cutting blade becomes about 20 µm, for example.

However, the substrate of the optical device wafer, such as a sapphire substrate and a silicon carbide substrate, has high Mohs hardness, so that cutting of the substrate by the cutting blade is not always easy. Accordingly, the depth of cut by the cutting blade cannot be set large, so that a cutting step must be performed plural times to cut the optical device wafer, causing a reduction in productivity.

As a method of dividing an optical device wafer along the streets, a laser processing method using a pulsed laser beam for performing ablation to the wafer has been proposed to solve the above problem. In this laser processing method, the pulsed laser beam is applied to the wafer along the streets to thereby form a laser processed groove on the wafer along each street as a break start point. Thereafter, an external force is applied to the wafer along each street where the laser processed groove is formed as the break start point, thereby breaking the wafer along each street (see Japanese Patent Laid-open No. Hei 10-305420, for example).

SUMMARY OF THE INVENTION

However, in the case that a laser beam having an absorption wavelength to a substrate constituting an optical device wafer, such as a sapphire substrate and a silicon carbide substrate, is applied to the wafer along the streets formed on the front side of the substrate to thereby form a laser processed groove along each street, there is a problem such that a modified substance produced in laser processing may be deposited to the side wall surface of each optical device such as a light emitting diode, causing a reduction in luminance of each optical device, so that the quality of each optical device is reduced.

It is therefore an object of the present invention to provide an optical device wafer processing method and a laser processing apparatus which can divide an optical device wafer into individual optical devices without reducing the quality of each optical device.

In accordance with an aspect of the present invention, there is provided an optical device wafer processing method for dividing an optical device wafer into individual optical devices along a plurality of crossing streets formed on the front side of the optical device wafer, the optical device wafer being composed of a substrate and an optical device layer formed on the front side of the substrate, the individual optical devices being respectively formed in a plurality of regions partitioned by the streets, the optical device wafer processing method including a laser processed groove forming step of applying a laser beam for performing ablation to the front side or back side of the substrate of the optical device wafer along the streets, thereby forming a laser processed groove as a break start point on the front side or back side of the substrate along each street; and a wafer dividing step of applying an external force to the optical device wafer after performing the laser processed groove forming step to thereby break the optical device wafer along each street where the laser processed groove is formed, thereby dividing the optical device wafer into the individual optical devices, wherein the laser processed groove forming step including the step of generating an etching gas atmosphere for etching a modified substance produced by applying the laser beam to the substrate, whereby an etching gas in the etching gas atmosphere is converted into a plasma by the application of the laser beam to thereby etch away the modified substance.

In accordance with another aspect of the present invention, there is provided a laser processing apparatus including a chuck table for holding a workpiece; laser beam applying means for applying a laser beam for performing ablation to the workpiece held on the chuck table, the laser beam applying means including laser beam oscillating means for oscillating the laser beam and focusing means for focusing the laser beam oscillated by the laser beam oscillating means toward the workpiece held on the chuck table; feeding means for relatively moving the chuck table and the laser beam applying means in a feeding direction; indexing means for relatively moving the chuck table and the laser beam applying means in an indexing direction perpendicular to the feeding direction; and etching gas atmosphere generating means for generating an etching gas atmosphere for etching a modified substance produced by applying the laser beam from the focusing means to a subject area of the workpiece to be processed by the laser beam.

In the optical device wafer processing method according to the present invention, the laser processed groove forming step is performed in such a manner that the laser beam for performing ablation to the substrate of the optical device wafer is applied to the front side or back side of the substrate along the streets, thereby forming the laser processed groove as the break start point on the front side or back side of the substrate along each street. In performing this laser processed groove forming step, the etching gas atmosphere for etching the modified substance produced by applying the laser beam to the substrate is generated, whereby the etching gas in the etching gas atmosphere is converted into a plasma by the application of the laser beam to thereby etch away the modified substance. As a result, the modified substance is not deposited to the wall surface of each laser processed groove formed on the substrate. Furthermore, the wall surface of each laser processed groove is formed as a rough surface by etching. Accordingly, in each optical device obtained by the wafer dividing step, the modified substance absorbing light to cause a reduction in luminance is not present on the side wall surface of the substrate. Furthermore, the side wall surface of the substrate is formed as a rough surface, so that light can be effectively emitted to improve the luminance.

The laser processing apparatus according to the present invention includes the etching gas atmosphere generating means for generating the etching gas atmosphere for etching the modified substance produced by applying the laser beam from the focusing means to the subject area of the workpiece to be processed by the laser beam. Accordingly, by operating the etching gas atmosphere generating means to generate the etching gas atmosphere at the subject area of the workpiece, the etching gas is converted into a plasma by the application of the laser beam to thereby etch away the modified substance. As a result, the modified substance is not deposited to the wall surface of a laser processed groove formed on the workpiece, and the wall surface of the laser processed groove is formed as a rough surface by etching.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 2 is a schematic view showing a preferred embodiment of laser beam applying means included in the laser processing apparatus shown in FIG. 1;

FIGS. 4A and 4B are perspective views for illustrating a wafer supporting step of attaching the optical device wafer shown in FIG. 3A to a dicing tape supported to an annular frame;

DETAILED DESCRIPTION OF THE PREFERRED EMBODIMENTS

Figure 1:
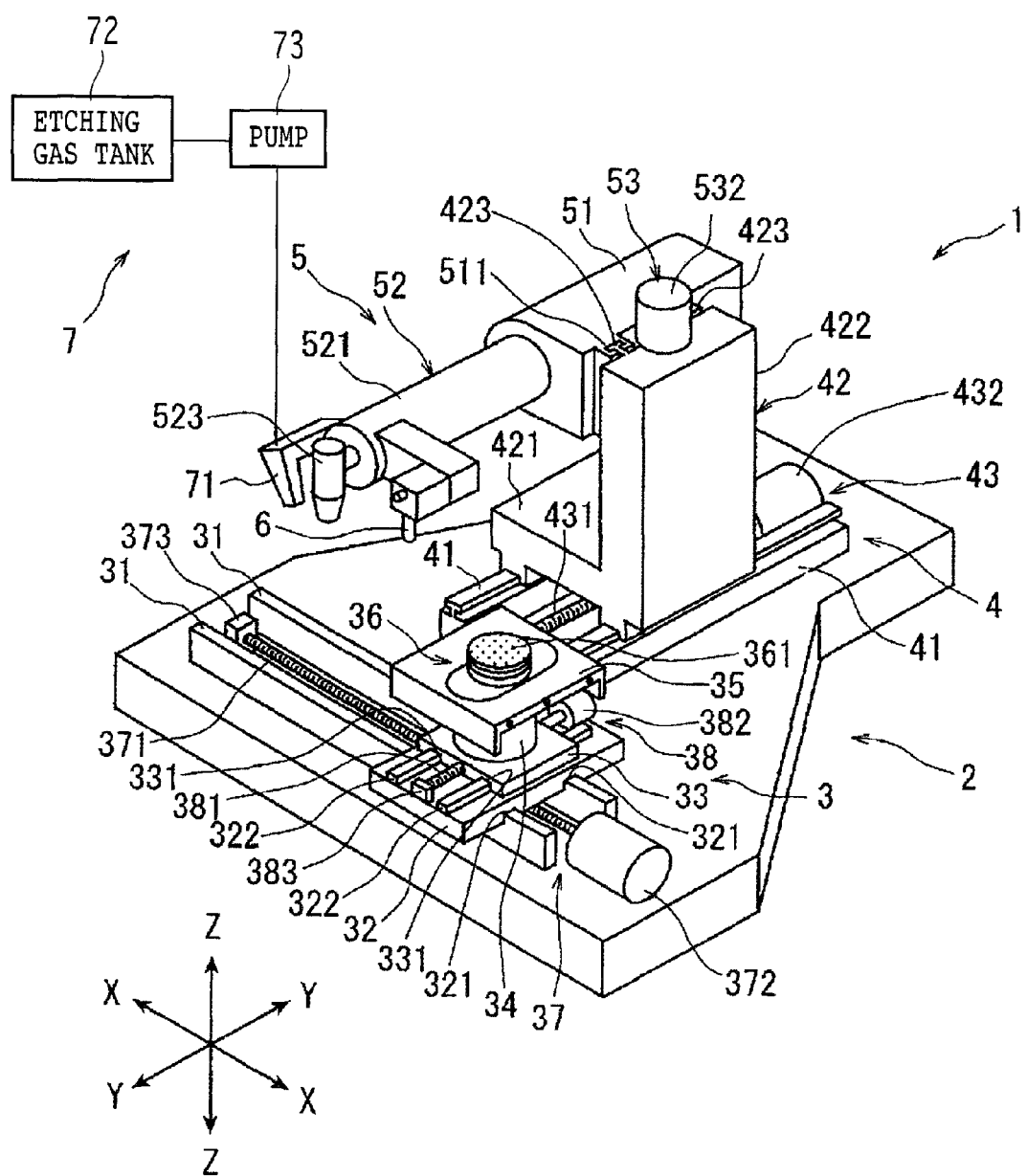
FIG. 1 is a perspective view of a laser processing apparatus according to the present invention.

A preferred embodiment of the optical device wafer processing method and the laser processing apparatus according to the present invention will now be described in detail with reference to the attached drawings. FIG. 1 is a perspective view of a laser processing apparatus 1 according to a preferred embodiment of the present invention. The laser processing apparatus 1 shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a support table 35 supported by a cylindrical member 34 standing on the second slide block 33, and a chuck table 36 as workpiece holding means. The chuck table 36 has a workpiece holding surface 361 formed of a porous material. The workpiece holding surface 361 is in communication with suction means (not shown). Accordingly, by operating this suction means in the condition where an optical device wafer (which will be hereinafter described) as a workpiece is placed on the workpiece holding surface 361 of the chuck table 36, the optical device wafer is held under suction on the workpiece holding surface 361. Further, the chuck table 36 is rotatable by a pulse motor (not shown) provided in the cylindrical member 34.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes feeding means 37 for moving the first slide block 32 in the X direction along the guide rails 31. The feeding means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes first indexing means 38 for moving the second slide block 33 in the Y direction along the guide rails 322. The first indexing means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser beam applying unit supporting mechanism 4 includes a pair of guide rails 41 provided on the stationary base 2 so as to extend parallel to each other in the Y direction and a movable support base 42 provided on the guide rails 41 so as to be movable in the Y direction. The movable support base 42 is composed of a horizontal portion 421 slidably supported to the guide rails 41 and a vertical portion 422 extending vertically upward from the upper surface of the horizontal portion 421. Further, a pair of guide rails 423 are provided on one side surface of the vertical portion 422 so as to extend parallel to each other in the Z direction. The laser beam applying unit supporting mechanism 4 further includes second indexing means 43 for moving the movable support base 42 in the Y direction along the guide rails 41. The second indexing means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 at a central portion thereof. Accordingly, the movable support base 42 is moved in the Y direction along the guide rails 41 by operating the pulse motor 432 to normally or reversely rotate the externally threaded rod 431.

The laser beam applying unit 5 includes a unit holder 51 and laser beam applying means 52 mounted to the unit holder 51. The unit holder 51 is formed with a pair of guided grooves 511 for slidably engaging the pair of guide rails 423 provided on the vertical portion 422 of the movable support base 42. Accordingly, the unit holder 51 is supported to the movable support base 42 so as to be movable in the Z direction by the slidable engagement of the guided grooves 511 with the guide rails 423.

The laser beam applying unit 5 further includes focal position adjusting means 53 for moving the unit holder 51 along the guide rails 423 in the Z direction. The focal position adjusting means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 52 are moved in the Z direction along the guide rails 423 by operating the pulse motor 532 to normally or reversely rotate this externally threaded rod. In this preferred embodiment, when the pulse motor 532 is normally operated, the laser beam applying means 52 is moved upward, whereas when the pulse motor 532 is reversely operated, the laser beam applying means 52 is moved downward.

The laser beam applying means 52 includes a cylindrical casing 521 fixed to the unit holder 51 so as to extend in a substantially horizontal direction. The laser beam applying means 52 will now be described in detail with reference to FIG. 2. The laser beam applying means 52 shown in FIG. 2 includes pulsed laser beam oscillating means 522 provided in the casing 521 and focusing means 523 for focusing a pulsed laser beam LB oscillated by the pulsed laser beam oscillating means 522 and applying this pulsed laser beam LB to a workpiece W held on the chuck table 36. The pulsed laser beam oscillating means 522 includes a pulsed laser beam oscillator and repetition frequency setting means to oscillate the pulsed laser beam LB for performing ablation to the workpiece W.

As shown in FIG. 2, the focusing means 523 constituting the laser beam applying means 52 is composed of a direction changing mirror 523a for changing the traveling direction of the pulsed laser beam LB oscillated from the pulsed laser beam oscillating means 522 to a downward direction as viewed in FIG. 2., i.e., toward the chuck table 36 and a focusing lens 523b for focusing the pulsed laser beam LB reflected by the direction changing mirror 523a and applying this pulsed laser beam LB to the workpiece W held on the chuck table 36.

Referring back to FIG. 1, imaging means 6 is mounted on the front end portion of the casing 521 constituting the laser beam applying means 52. The imaging means 6 functions to detect a subject area of the workpiece to be laser-processed by the laser beam applying means 52. The imaging means 6 includes illuminating means for illuminating the workpiece, an optical system for capturing an area illuminated by the illuminating means, and an imaging device (CCD) for detecting an image corresponding to the area captured by the optical system. An image signal output from the imaging means 6 is transmitted to control means (not shown).

The laser processing apparatus 1 further includes etching gas atmosphere generating means 7 for generating an etching gas atmosphere for etching a modified substance produced by applying the laser beam from the focusing means 523 to the subject area of the workpiece. This etching gas atmosphere generating means 7 includes an etching gas nozzle 71 provided at the front end portion of the casing 521 of the laser beam applying means 52, an etching gas tank 72 for storing an etching gas to be discharged from the etching gas nozzle 71, and a pump 73 for feeding the etching gas from the etching gas tank 72 to the etching gas nozzle 71. The etching gas nozzle 71 functions to discharge the etching gas toward the subject area of the workpiece to be processed by the laser beam applied from the focusing means 523. The etching gas stored in the etching gas tank 72 may be selected from any gases capable of etching the modified substance produced by applying the laser beam to the substrate of the optical device wafer, such as a sapphire substrate and a silicon carbide substrate. Examples of the etching gas include boron trichloride ($BCl_3$), chlorine ($Cl_2$), dichloromethane ($CH_2Cl_2$), a mixed gas of boron trichloride ($BCl_3$) and chlorine ($Cl_2$), a mixed gas obtained by mixing argoic acid (Ar) or xenoic acid (Xe) into this mixed gas of $BCl_3$ and $Cl_2$, and a fluoride gas such as $CF_4$ and $SF_6$. These etching gases can also etch a modified substance produced by applying the laser beam to gallium nitride (GaN) forming a light emitting layer (epitaxial layer) as an optical device layer formed on the substrate of the optical device wafer, such as a sapphire substrate and a silicon carbide substrate.

Figure 3A:
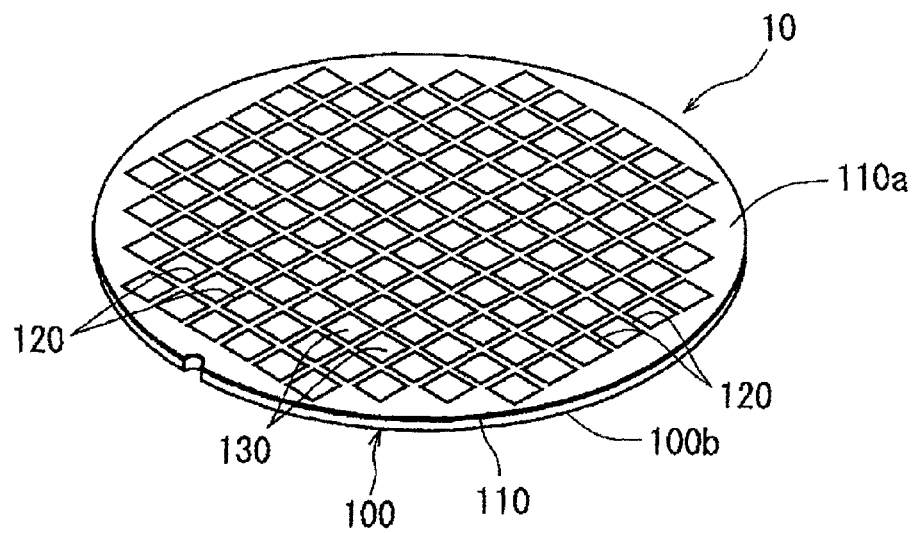
FIG. 3A is a perspective view of an optical device wafer to be processed by the optical device wafer processing method according to the present invention.
Figure 3B:
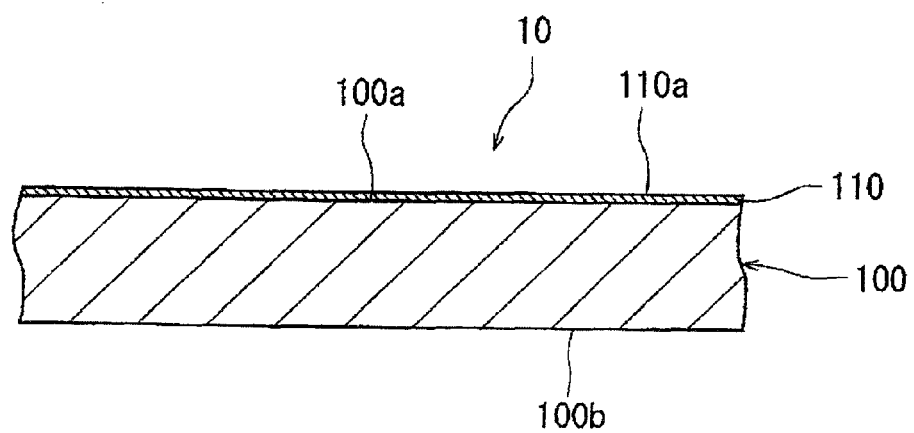
FIG. 3B is an enlarged sectional view of an essential part of the optical device wafer shown in FIG. 3A.

The operation of the laser processing apparatus 1 will now be described. FIG. 3A is a perspective view of an optical device wafer 10 to be processed by the optical device wafer processing method according to the present invention, and FIG. 3B is an enlarged sectional view of an essential part of the optical device wafer 10 shown in FIG. 3A. The optical device wafer 10 shown in FIGS. 3A and 3B is composed of a substrate 100 having a front side 100a and a back side 100b and a light emitting layer (epitaxial layer) 110 as an optical device layer formed on the front side 100a of the substrate 100. The substrate 100 is formed of sapphire or silicon carbide, for example, and the light emitting layer 110 is formed of a nitride semiconductor, for example. The substrate 100 has a thickness of 100 µm, for example, and the light emitting layer 110 has a thickness of 5 µm, for example. Reference numeral 110a denotes the front side of the light emitting layer 110, i.e., the front side of the optical device wafer 10. The light emitting layer 110 is partitioned into a plurality of rectangular regions by a plurality of crossing streets 120. In these rectangular regions, a plurality of optical devices 130 such as light emitting diodes (LEDs) and laser diodes (LDs) are respectively formed. There will now be described a laser processed groove forming step of applying a laser beam for performing ablation to the front side or back side of the substrate 100 of the optical device wafer 10 along the streets 120 by using the laser processing apparatus 1 mentioned above, thereby forming a laser processed groove as a break start point on the front side or back side of the substrate 100 along each street 120.

First, a wafer supporting step is performed in such a manner that the back side 100b of the substrate 100 of the wafer 10 is attached to a dicing tape supported to an annular frame. More specifically, as shown in FIGS. 4A and 4B, a dicing tape T is supported at its outer circumferential portion to an annular frame F so as to close the inner opening of the annular frame F. The back side 100b of the substrate 100 of the wafer 10 is attached to the front side (adhesive surface) of the dicing tape T.

After performing the wafer supporting step mentioned above, the wafer 10 supported through the dicing tape T to the annular frame F is placed on the chuck table 36 of the laser processing apparatus 1 shown in FIG. 1 in the condition where the dicing tape T comes into contact with the upper surface of the chuck table 36. Thereafter, the suction means is operated to hold the wafer 10 through the dicing tape T on the chuck table 36 under suction (wafer holding step). Accordingly, the wafer 10 is held on the chuck table 36 in the condition where the front side 110a of the light emitting layer 110 formed on the front side 100a of the substrate 100 is oriented upward.

After performing the wafer holding step mentioned above, the feeding means 37 is operated to move the chuck table 36 holding the wafer 10 to a position directly below the imaging means 6. In the condition where the chuck table 36 is positioned directly below the imaging means 6, an alignment operation is performed by the imaging means 6 and the control means to detect a subject area of the wafer 10 to be laser-processed. More specifically, the imaging means 6 and the control means perform image processing such as pattern matching for making the alignment of the streets 120 extending in a first direction on the wafer 10 and the focusing means 523 of the laser beam applying means 52 for applying the laser beam along the streets 120, thereby performing the alignment of a laser beam applying position. This alignment operation is performed similarly for the other streets 120 extending in a second direction perpendicular to the first direction mentioned above on the wafer 10.

Figure 5A:
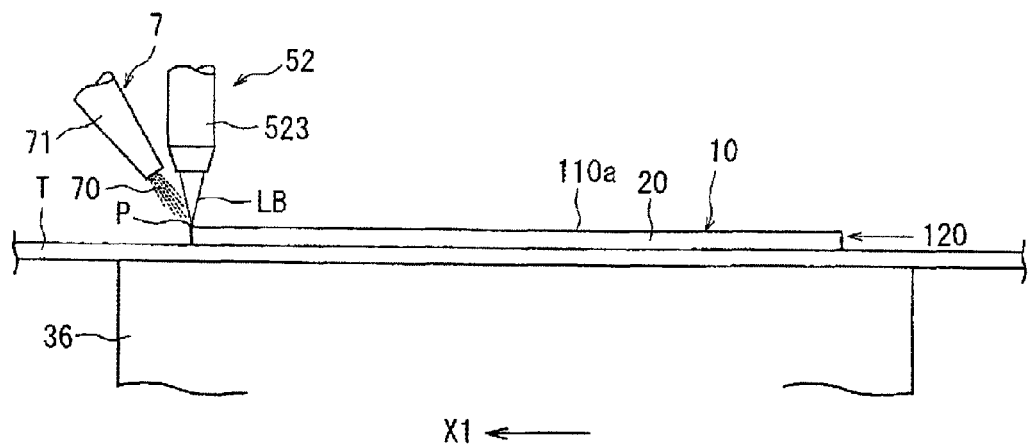
FIGS. 5A and 5B are sectional side views for illustrating a laser processed groove forming step in the optical device wafer processing method using the laser processing apparatus shown in FIG. 1.

After performing the alignment operation to detect all of the crossing streets 120 extending in the first and second directions on the wafer 10 held on the chuck table 36, the chuck table 36 is moved to position one end (left end as viewed in FIG. 5A) of a predetermined one of the streets 120 extending in the first direction directly below the focusing means 523 of the laser beam applying means 52 as shown in FIG. 5A. Thereafter, the focal point P of the pulsed laser beam LB to be applied from the focusing means 523 is set near the front side 110a (upper surface) of the light emitting layer 110 of the wafer 10.

Figure 5B:
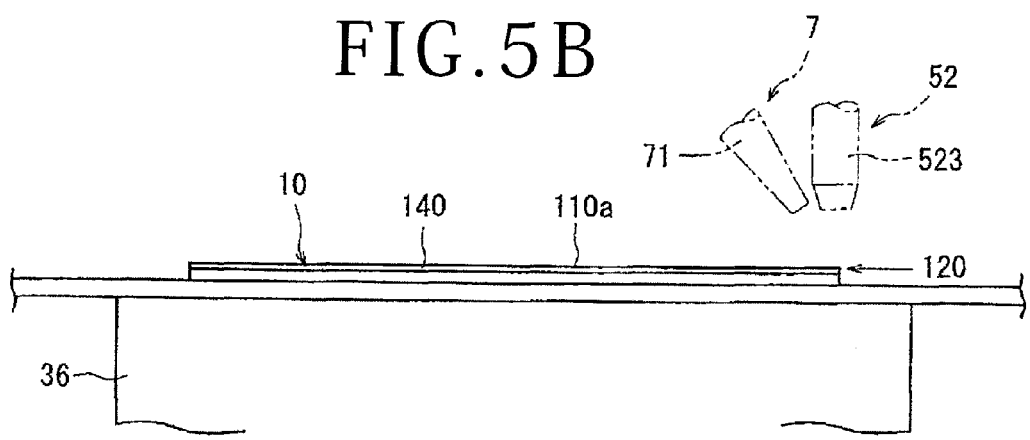

Thereafter, the laser beam applying means 52 is operated to apply the pulsed laser beam LB having an absorption wavelength to the substrate 100 from the focusing means 523 to the wafer 10. At the same time, the etching gas atmosphere generating means 7 is operated to discharge an etching gas 70 from the etching gas nozzle 71 toward the subject area of the wafer 10 to be laser-processed. Further, the chuck table 36 is moved in the direction shown by an arrow X1 in FIG. 5A at a predetermined feed speed. When the other end (right end as viewed in FIG. 5B) of the predetermined street 120 reaches the position directly below the focusing means 523 as shown in FIG. 5B, the application of the pulsed laser beam is stopped and the movement of the chuck table 36 is also stopped (laser processed groove forming step).

Figure 5C:
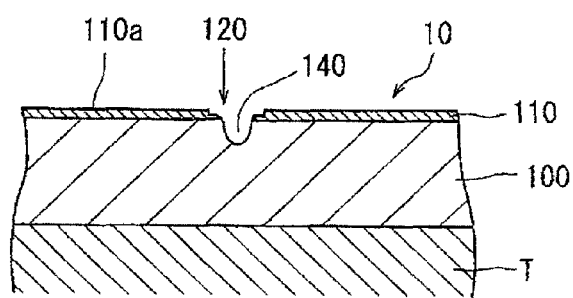
FIG. 5C is an enlarged sectional view of an essential part of the optical device wafer shown in FIG. 5B.

In this laser processed groove forming step, the etching gas atmosphere generating means 7 is operated to discharge the etching gas 70 from the etching gas nozzle 71, thereby generating an etching gas atmosphere for etching a modified substance produced by the application of the laser beam at the subject area of the wafer 10 to be processed by the laser beam. Accordingly, the etching gas is converted into a plasma by the pulsed laser beam applied to the wafer 10, As a result, a laser processed groove 140 having a depth reaching the substrate 100 from the front side 110a of the light emitting layer 110 is formed on the front side of the wafer 10 along the predetermined street 120 as shown in FIGS. 5B and 5C. As described above, the modified substance produced by the application of the pulsed laser beam to the wafer 10 is etched away by the etching gas. Accordingly, the modified substance is not deposited to the wall surface of the laser processed groove 140. Furthermore, the wall surface of the laser processed groove 140 is formed as a rough surface by etching. The present inventor conducted a test to confirm that etching can be effectively performed by using $CF_4$ as the etching gas.

For example, the laser processed groove forming step mentioned above is performed under the following processing conditions.

Light source: semiconductor
   pumped solid-state
   laser (Nd:YAG)
Wavelength: 355 nm
Average power: 3.5 W
Pulse width: 180 ns
Repetition frequency: 100 kHz
Focused spot diameter: ϕ10 µm
Work feed speed: 60 mm/sec
Depth of laser processed groove: 15 µm After performing the laser processed groove forming step along all of the streets 120 extending in the first direction, the chuck table 36 is rotated 90° to similarly perform the laser processed groove forming step along all of the other streets 120 extending in the second direction perpendicular to the first direction.

Figure 6:
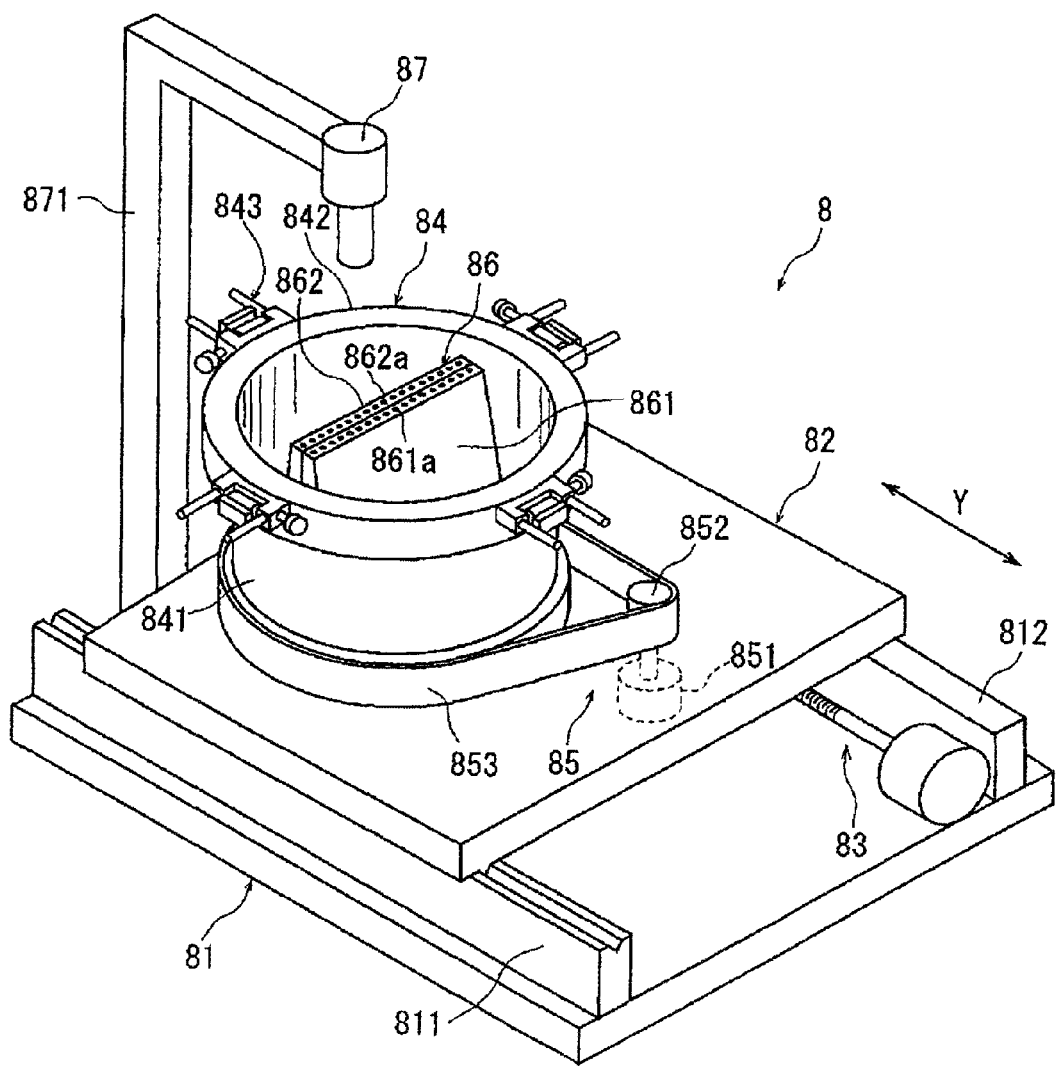
FIG. 6 is a perspective view of a wafer dividing apparatus for performing a wafer dividing step in the optical device wafer processing method according to the present invention.

After performing the laser processed groove forming step along all of the streets 120 extending in the second direction, a wafer dividing step is performed in such a manner that an external force is applied to the wafer 10 to thereby break the wafer 10 along each street 120 where the laser processed groove 140 as a break start point is formed, thereby dividing the wafer 10 into the individual optical devices 130. This wafer dividing step is performed by using a wafer dividing apparatus 8 shown in FIG. 6. The wafer dividing apparatus 8 shown in FIG. 6 includes a base 81 and a moving table 82 provided on the base 81 so as to be movable in the direction shown by an arrow Y in FIG. 6. The base 81 is a rectangular platelike member, and a pair of parallel guide rails 811 and 812 are provided on the upper surface of the base 81 near the opposite side portions thereof so as to extend in the direction of the arrow Y. The moving table 82 is movably mounted on the two guide rails 811 and 812. The moving table 82 is movable in the direction of the arrow Y by moving means 83. Frame holding means 84 for holding the annular frame F is provided on the moving table 82. The frame holding means 84 includes a cylindrical body 841, an annular frame holding member 842 formed at the upper end of the cylindrical body 841, and a plurality of clamps 843 as fixing means provided on the outer circumference of the frame holding member 842. The annular frame F is placed on the frame holding member 842 and fixed by the clamps 843. The wafer dividing apparatus 8 further includes rotating means 85 for rotating the frame holding means 84. The rotating means 85 includes a pulse motor 851 provided on the moving table 82, a pulley 852 mounted on the rotating shaft of the pulse motor 851, and an endless belt 853 wrapped between the pulley 852 and the cylindrical body 841. By operating the pulse motor 851, the frame holding means 84 is rotated through the pulley 852 and the endless belt 853.

The wafer dividing apparatus 8 further includes tension applying means 86 for applying a tensile force to the wafer 10 in a direction perpendicular to the streets 120 extending in a predetermined direction in the condition where the wafer 10 is supported through the dicing tape T to the annular frame F held on the annular frame holding member 842. The tension applying means 86 is provided inside the annular frame holding member 842. The tension applying means 86 includes a first suction holding member 861 and a second suction holding member 862, wherein each of the first and second suction holding members 861 and 862 has a rectangular holding surface elongated in a direction perpendicular to the direction of the arrow Y in FIG. 6. The first suction holding member 861 is formed with a plurality of suction holes 861a, and the second suction holding member 862 is formed with a plurality of suction holes 862a. These plural suction holes 861a and 862a are connected to suction means (not shown). The first and second suction holding members 861 and 862 are individually movable in the direction of the arrow Y by moving means (not shown). The tension applying means 86 and the frame holding means 84 are relatively movable in the direction of the arrow Y.

The wafer dividing apparatus 8 further includes detecting means 87 for detecting the streets 120 of the wafer 10 supported through the dicing tape T to the annular frame F held on the annular frame holding member 842. The detecting means 87 is mounted on an L-shaped support member 871 standing from the base 81. The detecting means 87 is constituted of an optical system, an imaging device (CCD), etc., and it is located above the tension applying means 86. The detecting means 87 functions to image the streets 120 of the wafer 10 supported through the dicing tape T to the annular frame F held on the annular frame holding member 842 and to transmit an image signal as an electrical signal to control means (not shown).

Figure 7A:
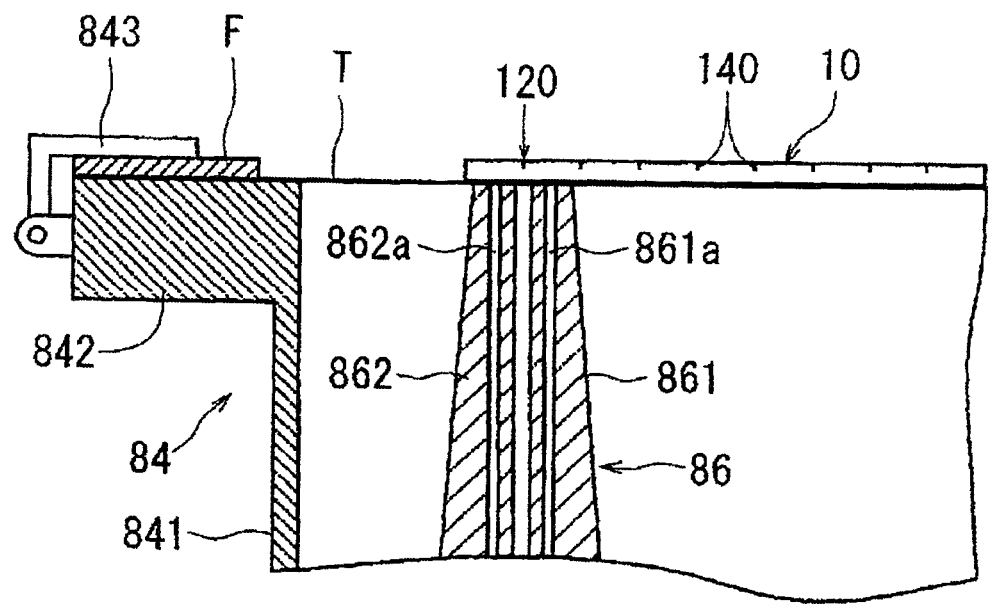
FIGS. 7A and 7B are sectional side views for illustrating the wafer dividing step.

The wafer dividing step using the wafer dividing apparatus 8 mentioned above will now be described with reference to FIGS. 7A and 7B. The annular frame F supporting the wafer 10 through the dicing tape T is placed on the frame holding member 842 and is next fixed to the frame holding member 842 by the clamps 843 as shown in FIG. 7A. Thereafter, the moving means 83 is operated to move the moving table 82 in the direction of the arrow Y shown in FIG. 6 so that a predetermined one of the streets 120 extending in the first direction perpendicular to the direction of the arrow Y (e.g., the leftmost street 120 as viewed in FIG. 7A) is positioned between the holding surface of the first suction holding member 861 of the tension applying means 86 and the holding surface of the second suction holding member 862 of the tension applying means 86 as shown in FIG. 7A. At this time, the predetermined street 120 is imaged by the detecting means 87 to position the holding surfaces of the first and second suction holding members 861 and 862 with respect to the predetermined street 120. Thereafter, the suction means is operated to produce a vacuum in the suction holes 861a and 862a, thereby holding the wafer 10 through the dicing tape T on the holding surfaces of the first and second suction holding members 861 and 862 (holding step).

Figure 7B:
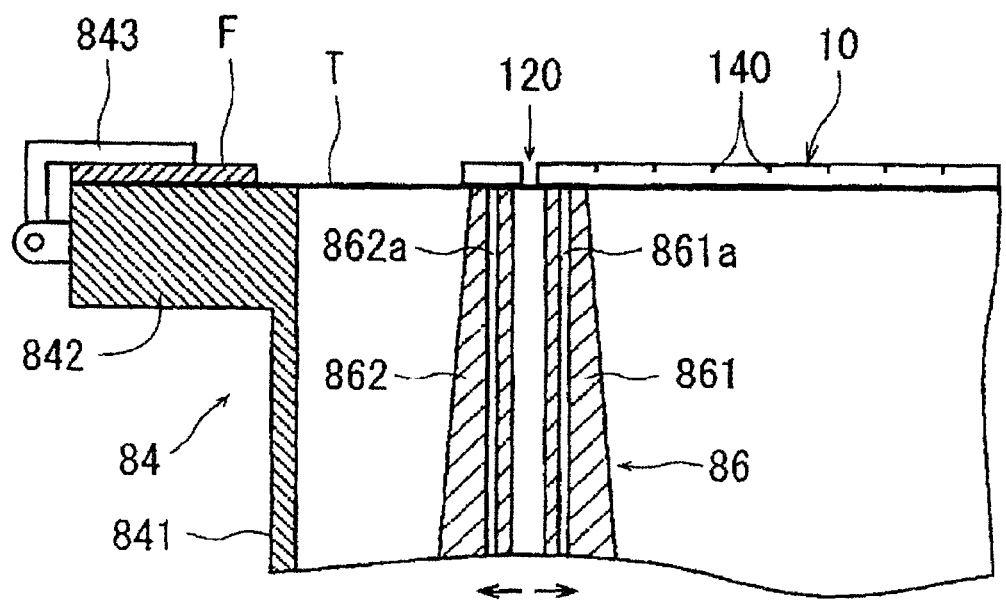

After performing this holding step, the moving means for moving the tension applying means 86 is operated to move the first suction holding member 861 and the second suction holding member 862 in the opposite directions (the direction of the arrow Y shown in FIG. 6) as shown in FIG. 7B. As a result, the predetermined street 120 positioned between the holding surface of the first suction holding member 861 and the holding surface of the second suction holding member 862 receives a tensile force in the direction of the arrow Y perpendicular to the predetermined street 120, so that the wafer 10 is broken along this predetermined street 120 where the laser processed groove 140 as the break start point is formed on the front side of the wafer 10 (breaking step). In this breaking step, the dicing tape T is slightly stretched. The laser processed groove 140 is formed along each street 120 and the strength of the wafer 10 is therefore reduced along each street 120. Accordingly, when the first and second suction holding members 861 and 862 holding the wafer 10 are moved in the opposite directions by a small amount of about 0.5 mm, for example, the wafer 10 can be easily broken along the predetermined street 120 where the laser processed groove 140 is formed on the substrate 100 as a break start point.

After performing the breaking step of breaking the wafer 10 along the predetermined street 120 mentioned above, the suction holding of the wafer 10 by the first and second suction holding members 861 and 862 is canceled. Thereafter, the moving means 83 is operated again to move the moving table 82 in the direction of the arrow Y shown in FIG. 6 by an amount corresponding to the pitch of the streets 120 so that the next street 120 adjacent to the predetermined street 120 mentioned above is positioned between the holding surface of the first suction holding member 861 and the holding surface of the second suction holding member 862. Thereafter, the holding step and the breaking step are performed similarly.

After performing the holding step and the breaking step for all of the streets 120 extending in the first direction, the rotating means 85 is operated to 90° rotate the frame holding means 84. As a result, the wafer 10 held to the frame holding member 842 of the frame holding means 84 is also rotated 90°, so that the other streets 120 extending in the second direction perpendicular to the first direction become parallel to the longitudinal direction of the holding surfaces of the first and second suction holding members 861 and 862. Thereafter, the holding step and the breaking step are performed similarly for all of the other streets 120 extending in the second direction, thereby dividing the wafer 10 into the individual optical devices 130 (wafer dividing step).

In performing the laser processed groove forming step of forming the laser processed groove 140 as a break start point along each street 120 on the front side of the light emitting layer 110 formed on the front side of the substrate 100 constituting the wafer 10 so that the laser processed groove 140 has a depth reaching the substrate 100, the etching gas atmosphere generating means 7 is operated to discharge the etching gas 70 from the etching gas nozzle 71, thereby generating the etching gas atmosphere for etching the modified substance produced by applying the laser beam from the focusing means 523 to the subject area of the wafer 10 to be laser-processed. Accordingly, the etching gas is converted into a plasma by the pulsed laser beam applied to the wafer 10, and this plasma functions to etch away the modified substance produced by the application of the pulsed laser beam to the wafer 10. As a result, the modified substance is not deposited to the wall surface of each laser processed groove 140. Furthermore, the wall surface of each laser processed groove 140 is formed as a rough surface by etching. Accordingly, in each optical device 130 obtained by dividing the wafer 10, the modified substance absorbing light to cause a reduction in luminance is not present on the side wall surface of the substrate 100 of each optical device 130. Furthermore, the side wall surface of the substrate 100 of each optical device 130 is formed as a rough surface, so that light can be effectively emitted from each optical device 130 to improve the luminance.

While a specific preferred embodiment of the present invention has been described, the present invention is not limited to this preferred embodiment, but various modifications may be made within the scope of the present invention. For example, the laser processed groove forming step in this preferred embodiment is performed by applying the laser beam along each street 120 to the front side of the light emitting layer 110 formed on the front side of the substrate 100 of the wafer 10, thereby forming the laser processed groove 140 as a break start point on the front side of the wafer 10 along each street 120 so that the laser processed groove 140 has a depth reaching the substrate 100. Alternatively, the laser processed groove forming step in the optical device wafer processing method according to the present invention may be performed by applying a laser beam along each street 120 to the back side of the substrate 100 of the wafer 10, thereby forming a laser processed groove as a break start point on the back side of the substrate 100 along each street 120.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for dividing an optical device wafer into individual optical devices along a plurality of crossing streets formed on the front side of said optical device wafer, said optical device wafer being composed of a substrate and an optical device layer formed on the front side of said substrate, said individual optical devices being respectively formed in a plurality of regions partitioned by said streets, said optical device wafer processing method comprising:

a laser processed groove forming step of applying a laser beam for performing ablation to the front side or back side of said substrate of said optical device wafer along said streets, thereby forming a laser processed groove as a break start point on the front side or back side of said substrate along each street; and a wafer dividing step of applying an external force to said optical device wafer after performing said laser processed groove forming step to thereby break said optical device wafer along each street where said laser processed groove is formed, thereby dividing said optical device wafer into said individual optical devices, wherein said laser processed groove forming step includes the step of generating an etching gas atmosphere for etching a modified substance produced by applying said laser beam to said substrate, whereby an etching gas in said etching gas atmosphere is converted into a plasma by the application of said laser beam to thereby etch away said modified substance.

2. A laser processing apparatus comprising:
a chuck table for holding a workpiece;
laser beam applying means for applying a laser beam for performing ablation to said workpiece held on said chuck table, said laser beam applying means including laser beam oscillating means for oscillating said laser beam and focusing means for focusing said laser beam oscillated by said laser beam oscillating means toward said workpiece held on said chuck table;
feeding means for relatively moving said chuck table and said laser beam applying means in a feeding direction;
indexing means for relatively moving said chuck table and said laser beam applying means in an indexing direction perpendicular to said feeding direction; and
etching gas atmosphere generating means for generating an etching gas atmosphere for etching a modified substance produced by applying said laser beam from said focusing means to a subject area of said workpiece to be processed by said laser beam.

* * * * *

UNITED STATES PATENT AND TRADEMARK OFFICE
CERTIFICATE OF CORRECTION

PATENT NO. : 8,431,428 B2
APPLICATION NO. : 13/089767
DATED : April 30, 2013
INVENTOR(S) : Sekiya It is certified that error appears in the above-identified patent and that said Letters Patent is hereby corrected as shown below:

On the Title Page:

Under (30) Foreign Application Priority Data, insert --JAPAN 2010-099143 April 22, 2010--

Signed and Sealed this
Sixth Day of August, 2013

Teresa Stanek Rea
*Acting Director of the United States Patent and Trademark Office*